United States Patent
Lin et al.

(10) Patent No.: US 9,349,723 B2
(45) Date of Patent: May 24, 2016

(54) SEMICONDUCTOR DEVICE AND METHOD OF FORMING PASSIVE DEVICES

(75) Inventors: Yaojian Lin, Singapore (SG); Haijing Cao, Singapore (SG); Qing Zhang, Singapore (SG); Robert C. Frye, Piscataway, NJ (US)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/365,097

(22) Filed: Feb. 2, 2012

(65) Prior Publication Data

US 2012/0126369 A1 May 24, 2012

Related U.S. Application Data

(63) Continuation of application No. 11/958,546, filed on Dec. 18, 2007, now Pat. No. 8,124,490.

(60) Provisional application No. 60/871,416, filed on Dec. 21, 2006.

(51) Int. Cl.
*H01L 27/07* (2006.01)
*H01G 4/228* (2006.01)
(Continued)

(52) U.S. Cl.
CPC ............ *H01L 27/0794* (2013.01); *H01G 4/228* (2013.01); *H01G 4/33* (2013.01); *H01L 23/5223* (2013.01); *H01L 23/5227* (2013.01); *H01L 23/5228* (2013.01); *H01L 24/03* (2013.01); *H01L 27/016* (2013.01); *H01L 24/05* (2013.01); *H01L 24/11* (2013.01); *H01L 24/13* (2013.01); *H01L 28/40* (2013.01); *H01L 2224/0345* (2013.01); *H01L 2224/0346* (2013.01); *H01L 2224/0391* (2013.01); *H01L 2224/03452* (2013.01); *H01L 2224/0401* (2013.01); *H01L 2224/04042* (2013.01); *H01L 2224/05166* (2013.01); *H01L 2224/05171* (2013.01); *H01L 2224/05181* (2013.01); *H01L 2224/05186* (2013.01); *H01L 2224/05567* (2013.01);
(Continued)

(58) Field of Classification Search
CPC ............ H01L 23/5228; H01L 21/0682; H01L 27/0794; H01L 27/0805; H01L 28/40; H01L 29/66181; H01L 2924/1205; H01L 2924/19041
USPC .......... 257/296, 532, 535, E27.048, E27.071, 257/E29.342, E29.343, E21.017, E21.011, 257/533; 438/396
See application file for complete search history.

(56) References Cited

U.S. PATENT DOCUMENTS 4,963,741 A 10/1990 McMullin
5,736,448 A * 4/1998 Saia et al. ............... 438/393

(Continued)

*Primary Examiner* — Joseph C Nicely
(74) *Attorney, Agent, or Firm* — Robert D. Atkins; Atkins and Associates, P.C.

(57) ABSTRACT

A flip chip semiconductor device has a substrate with a plurality of active devices formed thereon. A passive device is formed on the substrate by depositing a first conductive layer over the substrate, depositing an insulating layer over the first conductive layer, and depositing a second conductive layer over the insulating layer. The passive device is a metal-insulator-metal capacitor. The deposition of the insulating layer and first and second conductive layers is performed without photolithography. An under bump metallization (UBM) layer is formed on the substrate in electrical contact with the plurality of active devices. A solder bump is formed over the UBM layer. The passive device can also be a resistor by depositing a resistive layer over the first conductive layer and depositing a third conductive layer over the resistive layer. The passive device electrically contacts the solder bump.

14 Claims, 8 Drawing Sheets

(51) Int. Cl.
*H01G 4/33* (2006.01)
*H01L 27/01* (2006.01)
*H01L 23/522* (2006.01)
*H01L 23/00* (2006.01)
*H01L 49/02* (2006.01)

(52) U.S. Cl.
CPC ............. *H01L2224/05572* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/1146* (2013.01); *H01L 2224/1148* (2013.01); *H01L 2224/11334* (2013.01); *H01L 2224/11849* (2013.01); *H01L 2224/131* (2013.01); *H01L 2224/13022* (2013.01); *H01L 2224/13111* (2013.01); *H01L 2224/13113* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/73207* (2013.01); *H01L 2224/81815* (2013.01); *H01L 2924/0002* (2013.01); *H01L 2924/00014* (2013.01); *H01L 2924/01078* (2013.01); *H01L 2924/01079* (2013.01); *H01L 2924/04941* (2013.01); *H01L 2924/14* (2013.01); *H01L 2924/19041* (2013.01); *H01L 2924/19042* (2013.01); *H01L 2924/19043* (2013.01); *H01L 2924/30105* (2013.01)

(56) References Cited

U.S. PATENT DOCUMENTS

| | | | |
|---|---|---|---|
| 5,874,770 A * | 2/1999 | Saia et al. | 257/536 |
| 6,027,980 A | 2/2000 | Gardner | |
| 6,365,480 B1 * | 4/2002 | Huppert et al. | 438/381 |
| 6,448,708 B1 | 9/2002 | Chakravorty et al. | |
| 6,452,270 B1 | 9/2002 | Huang | |
| 6,459,117 B1 * | 10/2002 | Liou | 257/306 |
| 6,492,222 B1 | 12/2002 | Xing | |
| 6,500,724 B1 * | 12/2002 | Zurcher et al. | 438/384 |
| 6,555,864 B1 * | 4/2003 | Cross et al. | 257/310 |
| 6,838,717 B1 * | 1/2005 | Yen et al. | 257/295 |
| 6,902,981 B2 * | 6/2005 | Ng et al. | 438/381 |
| 6,919,244 B1 | 7/2005 | Remmel et al. | |
| 7,056,800 B2 * | 6/2006 | Croswell et al. | 438/381 |
| 7,078,310 B1 * | 7/2006 | Kar-Roy et al. | 438/396 |
| 7,214,990 B1 | 5/2007 | Lee et al. | |
| 7,259,077 B2 | 8/2007 | Degani et al. | |
| 7,306,986 B2 * | 12/2007 | Remmel et al. | 438/239 |
| 7,368,311 B2 * | 5/2008 | Tilmans | B81B 7/0006 257/E21.703 |
| 7,473,951 B2 | 1/2009 | Kim et al. | |
| 7,494,867 B2 * | 2/2009 | Kikuta et al. | 438/253 |
| 7,535,079 B2 | 5/2009 | Remmel et al. | |
| 7,579,694 B2 | 8/2009 | Jan et al. | |
| 7,645,619 B2 | 1/2010 | Oh et al. | |
| 7,727,879 B2 * | 6/2010 | Lin et al. | 438/622 |
| 8,120,183 B2 * | 2/2012 | Lin et al. | 257/758 |
| 8,513,130 B2 * | 8/2013 | Yaegashi | 438/695 |
| 2001/0013614 A1 * | 8/2001 | Joshi et al. | 257/295 |
| 2001/0054728 A1 | 12/2001 | Paz de Araujo et al. | |
| 2002/0164862 A1 | 11/2002 | Lepert et al. | |
| 2002/0179951 A1 * | 12/2002 | Yoshiyama et al. | 257/303 |
| 2003/0067053 A1 * | 4/2003 | Hori et al. | 257/532 |
| 2003/0080476 A1 | 5/2003 | Barton et al. | |
| 2004/0029404 A1 * | 2/2004 | Lin | H01L 23/522 257/300 |
| 2004/0072406 A1 * | 4/2004 | Ng | H01L 27/0682 438/396 |
| 2004/0104420 A1 | 6/2004 | Coolbaugh et al. | |
| 2004/0155278 A1 * | 8/2004 | Natori et al. | 257/306 |
| 2004/0191981 A1 | 9/2004 | Yates et al. | |
| 2005/0017355 A1 * | 1/2005 | Chou et al. | 257/738 |
| 2005/0017361 A1 * | 1/2005 | Lin et al. | 257/756 |
| 2005/0218520 A1 * | 10/2005 | Kikuta | H01L 23/5223 257/758 |
| 2005/0285173 A1 * | 12/2005 | Nagai et al. | 257/296 |
| 2006/0094185 A1 | 5/2006 | Jeong et al. | |
| 2006/0205170 A1 | 9/2006 | Rinne | |
| 2006/0231951 A1 * | 10/2006 | Jan et al. | 257/737 |
| 2007/0059879 A1 | 3/2007 | Ting | |
| 2007/0108551 A1 * | 5/2007 | Lin | H01L 23/5223 257/531 |
| 2007/0114634 A1 * | 5/2007 | Lin | H01L 23/50 257/528 |
| 2007/0148825 A1 * | 6/2007 | Kikuta et al. | 438/118 |
| 2007/0205520 A1 * | 9/2007 | Chou et al. | 257/780 |
| 2007/0235878 A1 * | 10/2007 | Lin | H01L 24/05 257/773 |
| 2008/0001254 A1 | 1/2008 | Wang | |
| 2008/0064179 A1 | 3/2008 | Yang | |
| 2008/0233731 A1 * | 9/2008 | Lin et al. | 438/597 |
| 2009/0001509 A1 * | 1/2009 | Lin | 257/531 |
| 2009/0004809 A1 | 1/2009 | Chinthakindi et al. | |
| 2009/0224365 A1 * | 9/2009 | Remmel et al. | 257/533 |
| 2010/0200951 A1 * | 8/2010 | Lin et al. | 257/536 |
| 2010/0218978 A1 | 9/2010 | Caldwell et al. | |
| 2011/0298091 A1 * | 12/2011 | Tachibana | 257/532 |
| 2012/0119329 A1 * | 5/2012 | Lin et al. | 257/532 |

* cited by examiner

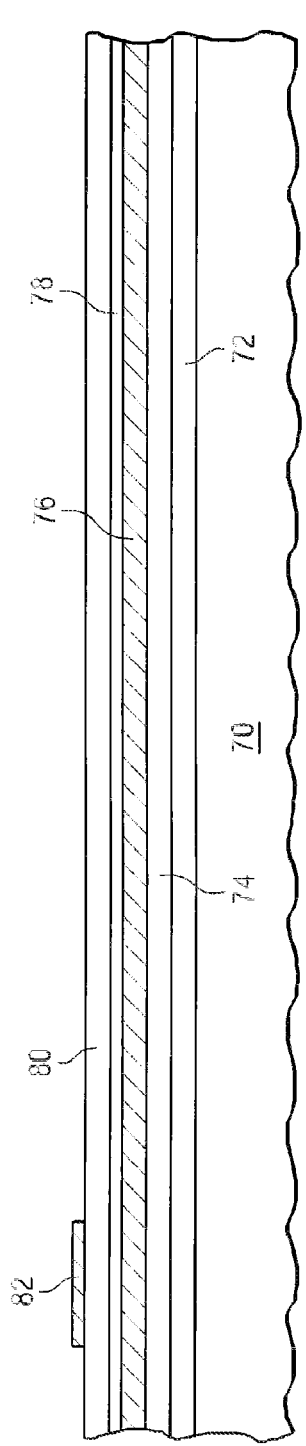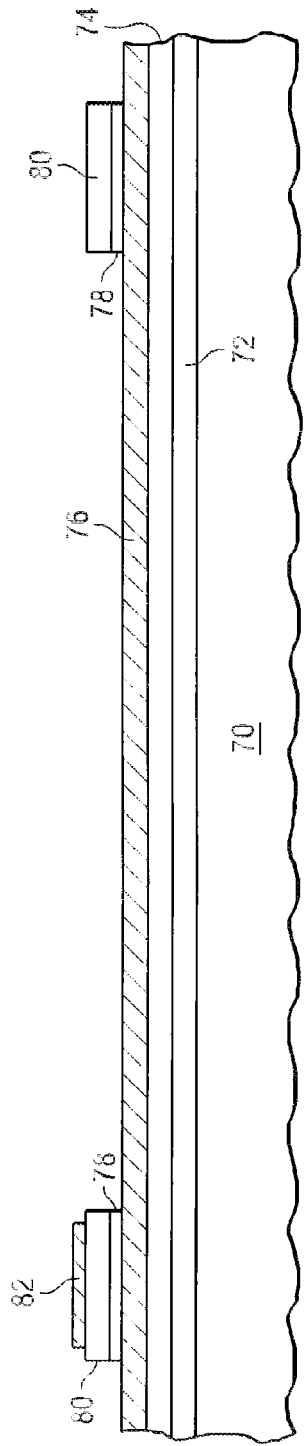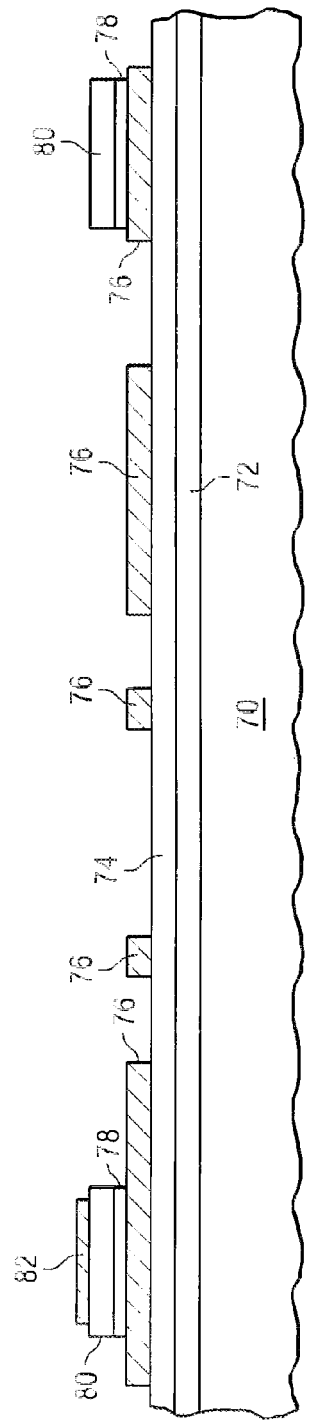

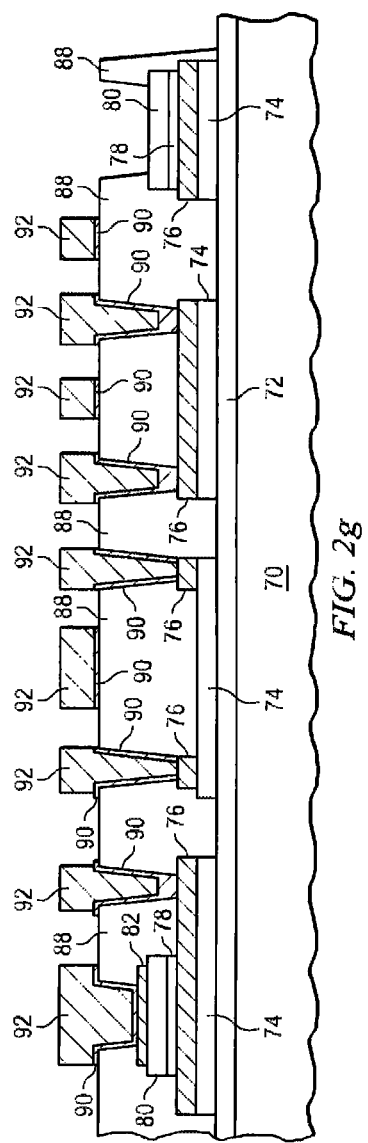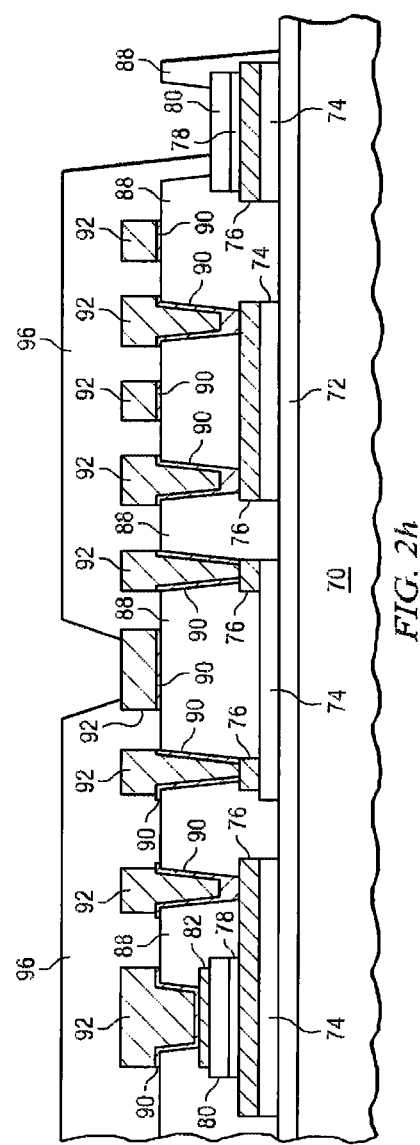

SEMICONDUCTOR DEVICE AND METHOD OF FORMING PASSIVE DEVICES

CLAIM TO DOMESTIC PRIORITY

The present invention is a continuation of U.S. patent application Ser. No. 11/958,546, filed Dec. 18, 2007, now U.S. patent No. 8,124,490, which claims the benefit of Provisional Application No. 60/871,416, filed Dec. 21, 2006.

FIELD OF THE INVENTION

The present invention relates in general to semiconductor devices and, more particularly, to formation of an interconnect structure for integrated passive devices (IPD) on semiconductor die.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In many applications, it is desirable to form passive circuit elements, e.g., capacitors and resistors, on the semiconductor die. The formation of passive circuit elements often involve photolithographic processes such as masking, application of photoresist, etching, wet and dry cleaning, and wafer handling. These processes can introduce particles and other contaminants into the layers that make up the passive circuit elements. The particles and contaminants can cause defects and reduce manufacturing yield.

A need exists to form passive circuit elements on a semiconductor die without introducing particles and contaminants into the device layers.

SUMMARY OF THE INVENTION

In one embodiment, the present invention is a method of making a semiconductor device comprising the steps of providing a substrate and forming a first insulating layer over the substrate. The method further includes the steps of forming a first conductive layer over the first insulating layer, a first resistive layer over the first conductive layer, and a second insulating layer over the first resistive layer without using a photolithography process. The method further includes the steps of forming a first passive device adapted to operate as a capacitor by (a) forming a second conductive layer over the second insulating layer, (b) forming the second insulating layer to leave a portion of the second insulating layer beneath the second conductive layer, (c) forming the first resistive layer to leave a portion of the first resistive layer beneath the portion of the second insulating layer, and (d) forming the first conductive layer to leave a first portion of the first conductive layer partially beneath the portion of the first resistive layer. The method further includes the steps of forming a third insulating layer over the first and second conductive layers and forming a third conductive layer over the third insulating layer. The third conductive layer is electrically connected to the first and second conductive layers.

In another embodiment, the present invention is a method of making a semiconductor device comprising the steps of providing a substrate and forming a first conductive layer over the substrate and a first insulating layer over the first conductive layer without using a photolithography process. The method further includes the steps of forming a first passive device adapted to operate as a capacitor by (a) forming a second conductive layer over the first insulating layer, (b) forming the first insulating layer to expose the first conductive layer, and (c) forming the first conductive layer to leave a first portion of the first conductive layer beneath and partially exposed by the first insulating layer.

In another embodiment, the present invention is a method of making a semiconductor device comprising the steps of providing a substrate and forming a first conductive layer over the substrate and a first insulating layer over the first conductive layer without using a photolithography process. The method further includes the steps of forming the first insulating layer to expose the first conductive layer and forming the first conductive layer to leave a first portion of the first conductive layer beneath the first insulating layer and a second portion of the first conductive layer exposed by the first insulating layer.

In another embodiment, the present invention is a semiconductor device comprising a substrate and a first passive device disposed over the substrate. The first passive device is adapted to operate as a capacitor and includes (a) a first conductive layer disposed over the substrate and including a first portion and a second portion abutting the first portion, (b) a first insulating layer disposed over the first portion of the first conductive layer without overlapping the second portion of the first conductive layer, and (c) a second conductive layer disposed over the first insulating layer.

BRIEF DESCRIPTION OF THE DRAWINGS

FIGS. 2a-2i illustrate a process of forming an interconnect structure and passive circuit elements;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
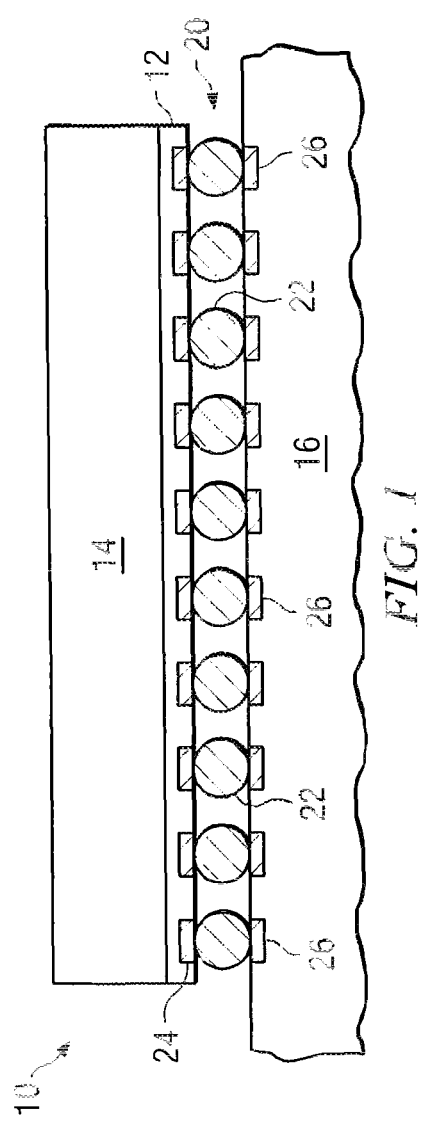
FIG. 1 is a flip chip semiconductor device with solder bumps providing electrical interconnect between an active area of the die and a chip carrier substrate.

Flip chip semiconductor packages and wafer level packages (WLP) are commonly used with integrated circuits (ICs) demanding high speed, high density, and greater pin count. Flip chip style semiconductor device 10 involves mounting an active area 12 of die 14 facedown toward a chip carrier substrate or printed circuit board (PCB) 16, as shown in FIG. 1. Active area 12 contains active and passive devices, conductive layers, and dielectric layers according to the electrical design of the die. Analog circuits may be created by the combination of one or more passive device formed within active area 12 and electrically interconnected. For example, an analog circuit may include one or more inductor, capacitor and resistor formed within active area 12. The electrical and mechanical interconnect is achieved through a solder bump structure 20 comprising a large number of individual conductive solder bumps or balls 22. The solder bumps are formed on bump pads or interconnect sites 24, which are disposed on active area 12. The bump pads 24 connect to the active circuits by conduction tracks in active area 12. The solder bumps 22 are electrically and mechanically connected to contact pads or interconnect sites 26 on carrier substrate 16 by a solder reflow process. The flip chip semiconductor device provides a short electrical conduction path from the active devices on die 14 to conduction tracks on carrier substrate 16 in order to reduce signal propagation, lower capacitance, and achieve overall better circuit performance.

Figure 2A:
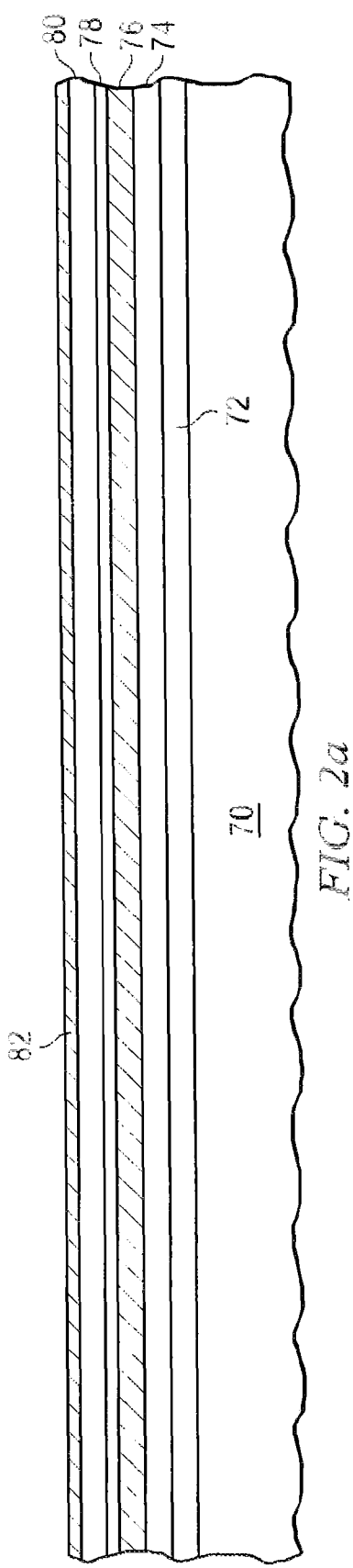

FIG. 2a illustrates a cross-sectional view of the formation of an interconnect structure and integrated passive devices (IPD) on the substrate. A substrate 70 is provided which is made of silicon, glass, dielectric, or other bulk semiconductor material. A passivation layer 72 is deposited over substrate 70. Passivation layer 72 can be made with silicon nitride (SixNy), silicon dioxide (SiO2), silicon oxynitride (SiON), polyimide (PI), benzocyclobutene (BCB), polybenzoxazole (PBO), or other insulating material. A resistive layer 74 is deposited over passivation layer 72. Resistive layer 74 is made with a conductive material having relative high resistivity, such as tantalum (Ta) silicide, doped poly-silicon, nickel chromium (NiCr), tantalum nitride (TaN), and titanium nitride (TiN). In one example, resistive layer 74 has a surface resistivity of 5-50 ohm/square. The deposition of resistive layer 74 may involve physical vapor deposition (PVD) or physical vapor deposition (CVD).

An electrically conductive layer 76 is deposited over resistive layer 74. Conductive layer 76 can be made with aluminum (Al), copper (Cu), tin (Sn), nickel (Ni), gold (Au), silver (Ag), or other electrically conductive material. Conductive layer 76 can made with single or multiple layers, for example with adhesion and barrier layers. The adhesion layer can be titanium (Ti), tantalum (Ta), and chromium (Cr). The barrier layer can be nickel vanadium (NiV), TiN, and TaN. The deposition of conductive layer 76 can use an electrolytic plating or electroless plating process, PVD, or CVD.

A second resistive layer 78, similar to resistive layer 74, is deposited over conductive layer 76. An insulating layer 80 is deposited over resistive layer 78. The insulating layer 80 is made with Si3N4, SiO2, SiON, tantalum pentoxide (Ta2O5), Zirconium (Zr) oxide, or other dielectric material. The deposition of insulating layer 80 may involve PVD or CVD with typical thickness of 50 to 4000 angstroms (A). An optional electrically conductive layer 82 is deposited over insulating layer 80. Conductive layer 82 can be made with Al, Cu, Sn, Ni, Au, Ag, or other electrically conductive material. Conductive layer 82 can be single or multiple layers, for example with adhesion and barrier layers. The adhesion layer can be Ti, Ta, or Cr. The barrier layer can be NiV, TiN, or TaN. The deposition of conductive layer 82 uses an electrolytic plating or electroless plating process, PVD, or CVD.

The formation of layers 72-82 is achieved by patterning and/or deposition of the materials described for each layer. The patterning and deposition of layers 72-82 does not involve any photolithography processes.

In FIG. 2b, a portion of conductive layer 82 is patterned using an etching process, leaving the portion of conductive layer 82 as shown in the figure. Note at this point in the process the layers 72-82 which will make up and constitute analog or passive circuit elements have already been formed by patterning and deposition. Accordingly, layers 72-78 have been isolated from particles and other contaminants introduced at the interface of insulating layer 80 and conductive layer 82 in the subsequent photolithographic process.

In FIG. 2c, portions of resistive layer 78 and insulating layer 80 are patterned using an etching process, leaving the portions of resistive layer 78 and insulating layer 80 as shown in the figure. A photoresist layer is used as the mask to etch resistive layer 78 and insulating layer 80. Alternatively, conductive layer 82 can be used as the mask. The portions of resistive layer 78 and insulating layer 80 which remain are typically wider than the remaining portion of conductive layer 82.

Figure 2E:
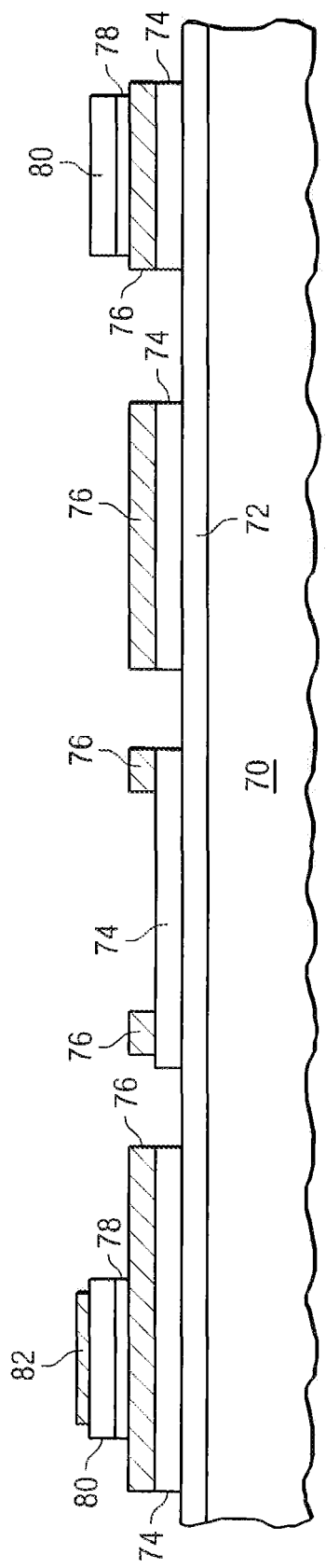

In FIG. 2d, portions of conductive layer 76 are patterned using an etching process, leaving the portions of conductive layer 76 as shown in the figure. In FIG. 2e, portions of resistive layer 74 are patterned using an etching process, leaving the portions of resistive layer 74 as shown in the figure. The photoresist and portions of conductive layer 76 are used as the mask for the etching process.

Figure 2F:
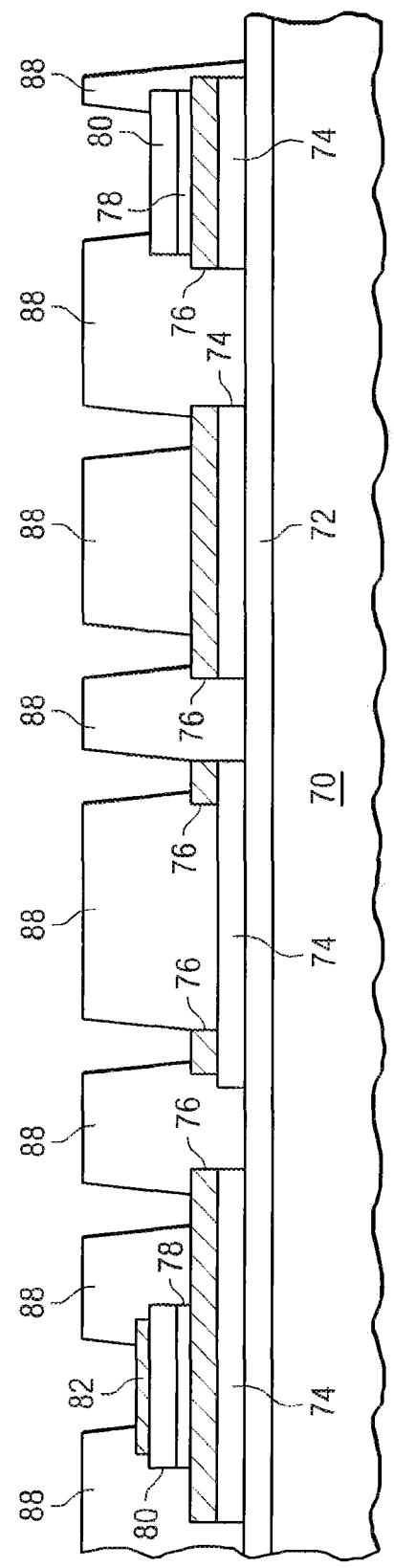

In FIG. 2f, passivation layer 88 is formed over the structure created in FIGS. 2a-2e for structural support and physical isolation. Passivation layer 88 can be made with SixNy, SiO2, SiON, PI, BCB, PBO, or other insulating material. Alternatively, passivation layer 88 can be photo-sensitive material. A portion of passivation layer 88 is removed using a wet resist developing process to expose conductive layers 76 and 82 and insulating layer 80.

In FIG. 2g, an adhesion layer 90 and electrically conductive layer 92 are formed by patterning and deposition as shown. Adhesion layer 90 can be made with Ti, TiW, Cr, Ta, or TaN. Conductive layer 92 can be made with Al, Cu, Sn, Ni, Au, Ag, or other electrically conductive material. The deposition of conductive layers 90 and 92 uses an electrolytic plating or electroless plating process, PVD, or CVD. The conductive layer 92 can be electrically common or electrically isolated depending on the connectivity of the individual devices formed on substrate 70.

In FIG. 2h, a passivation layer 96 is formed over the structure created in FIGS. 2a-2g for structural support and physical isolation. Passivation layer 96 can be made with SixNy, SiO2, SiON, PI, BCB, PBO, or other insulating material. Alternatively, passivation layer 88 can be photo-sensitive material. A portion of passivation layer 96 is removed using a wet resist developing process to expose conductive layer 92, which is used in the formation of the solder bump, and insulating layer 80.

Figure 2I:
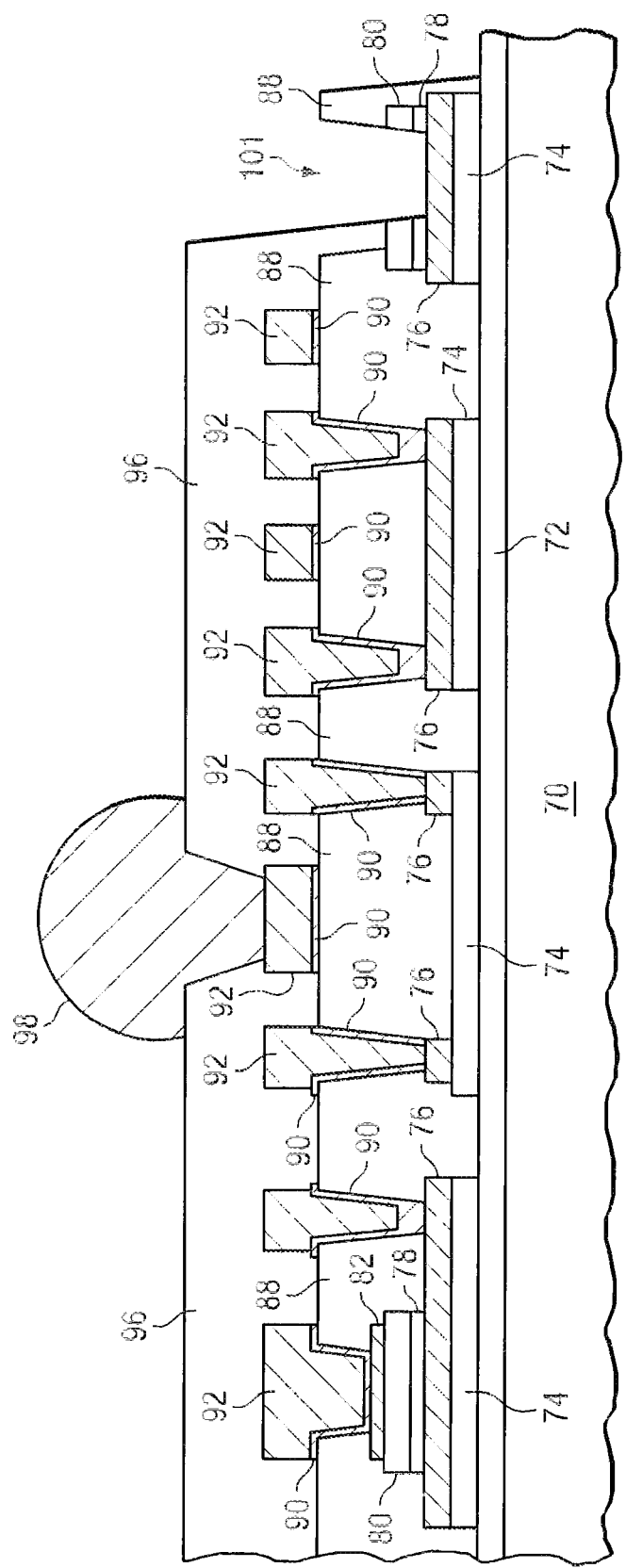

In FIG. 2i, an electrically conductive solder material is deposited over conductive layer 92 through an electrolytic plating or electroless plating process, solder paste printing process, or by pre-formed ball mounting process. Adhesive layer 90 and conductive layer 92 constitute an under bump metallization (UBM) structure. Alternatively, additional UBM layers may be applied under the solder and overlapping the UBM vias. The solder material can be any metal or electrically conductive material, e.g., Sn, Pb, Ni, Au, Ag, Cu, Bi, Sn/Ag alloy, Sn/Pb alloy. The solder material is reflowed by heating the conductive material above its melting point to form spherical ball or bump 98. In some applications, solder bump 98 is reflowed a second time to improve electrical contact to the UBM structure.

Further shown in FIG. 2i, insulating layer 80 and resistive layer 78 are exposed in openings of passivation layers 88 and 96 either after solder bumps 98 are formed or after patterning of passivation layer 96. Pad 101 is used for wire bonding.

The combination of conductive layer 76, resistive layer 78, insulating layer 80, and conductive layers 82, 90, and 92 constitute an analog or passive circuit, i.e., a metal-insulator-metal (MIM) capacitor with series resistor. The passive circuit can be electrically connected to solder bump 98 and wire bond pad 101 through conductive layers 92. Other examples of an analog or passive circuit include an inductor, capacitor, resistor, transmission line, or ground plane.

Note that the MIM capacitor and resistor are formed layer by layer as described in FIG. 2a, i.e., using patterning and deposition processes, but without using photolithographic processes. The layers constituting the passive circuit elements, including the dielectric media of the MIM capacitor, are sensitive to particles and other contaminants introduced during photolithographic processes such as etching, application of photoresist, wet and dry clean, and wafer handling. These processes are not utilized until the layers of the passive circuit elements are formed and isolated from such contaminants. The layer-by-layer continuous deposition for the passive circuit elements in FIG. 2a reduces defects in interfaces between layers, and improves manufacturing yield. The photolithographic processes in FIGS. 2b-2i occur after layer deposition for the passive circuit elements, i.e., the MIM capacitor and resistor layers.

Figure 3:
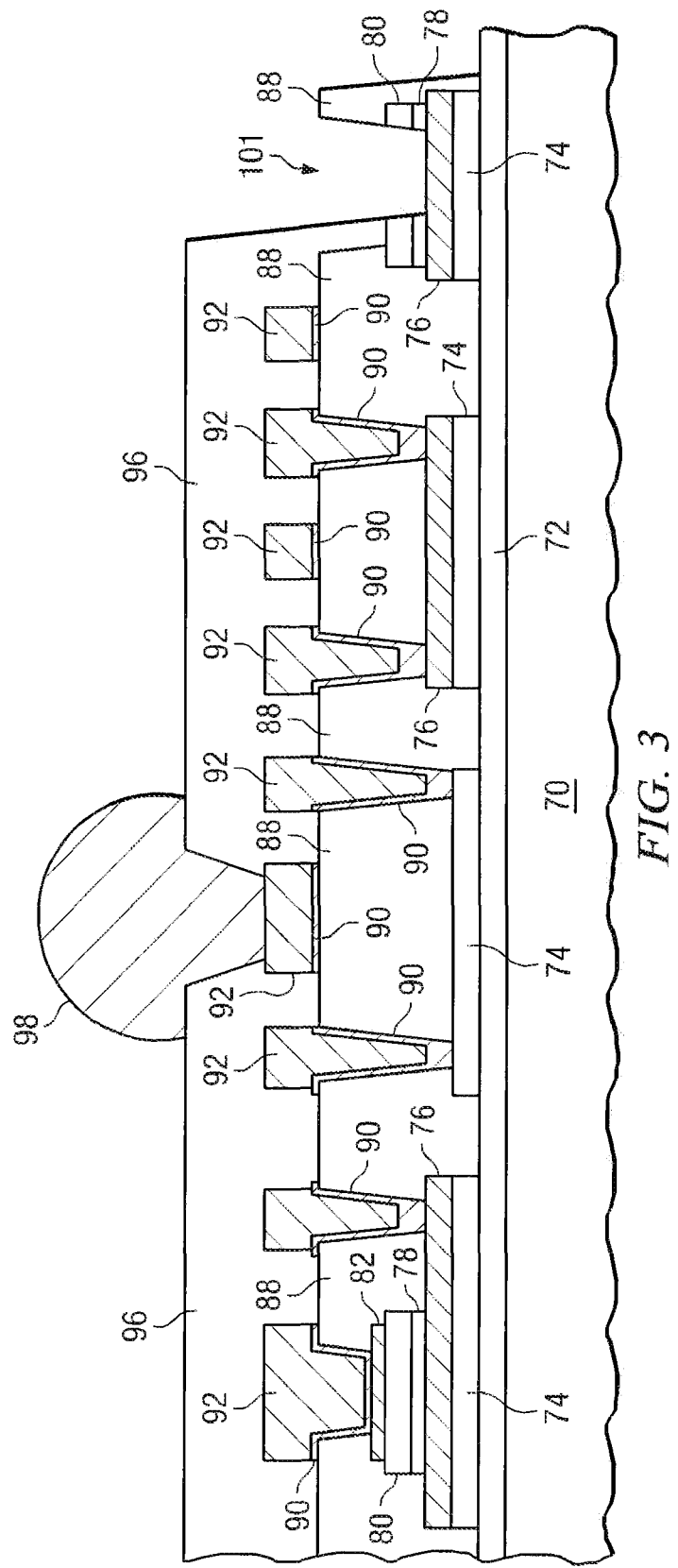
FIG. 3 illustrates an alternate embodiment of the interconnect structure and passive circuit elements.

In FIG. 3, a portion of conductive layer 76 is removed to make direct contact between adhesive layer 90 and conductive layer 92 and resistive layer 74 through vias in passivation layer 88.

Figure 4:
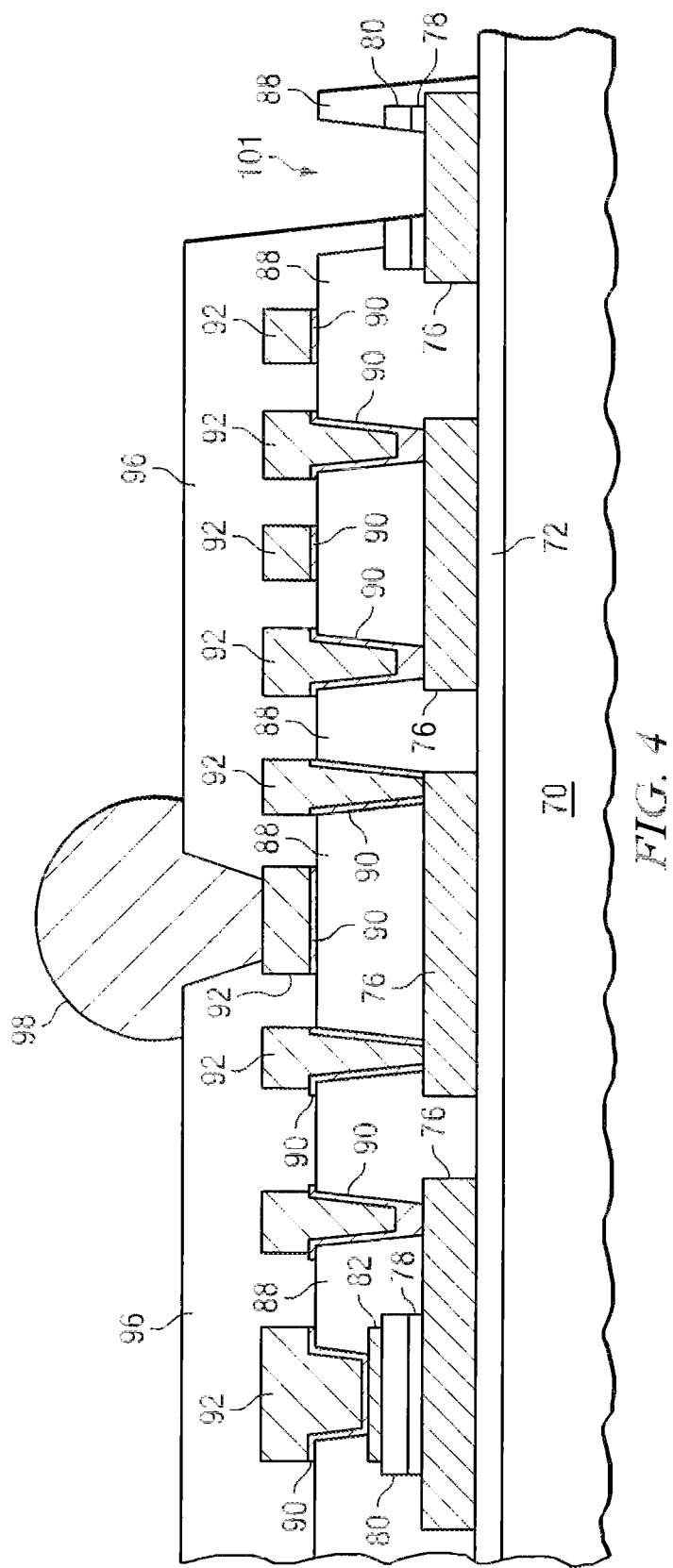
FIG. 4 illustrates another embodiment of the interconnect structure and passive circuit elements.

FIG. 4 shows an embodiment of the interconnect structure and IPDs without resistive layer 74. The embodiment in FIG. 4 has applications in balun circuits that do not require any resistor component.

Figure 5:
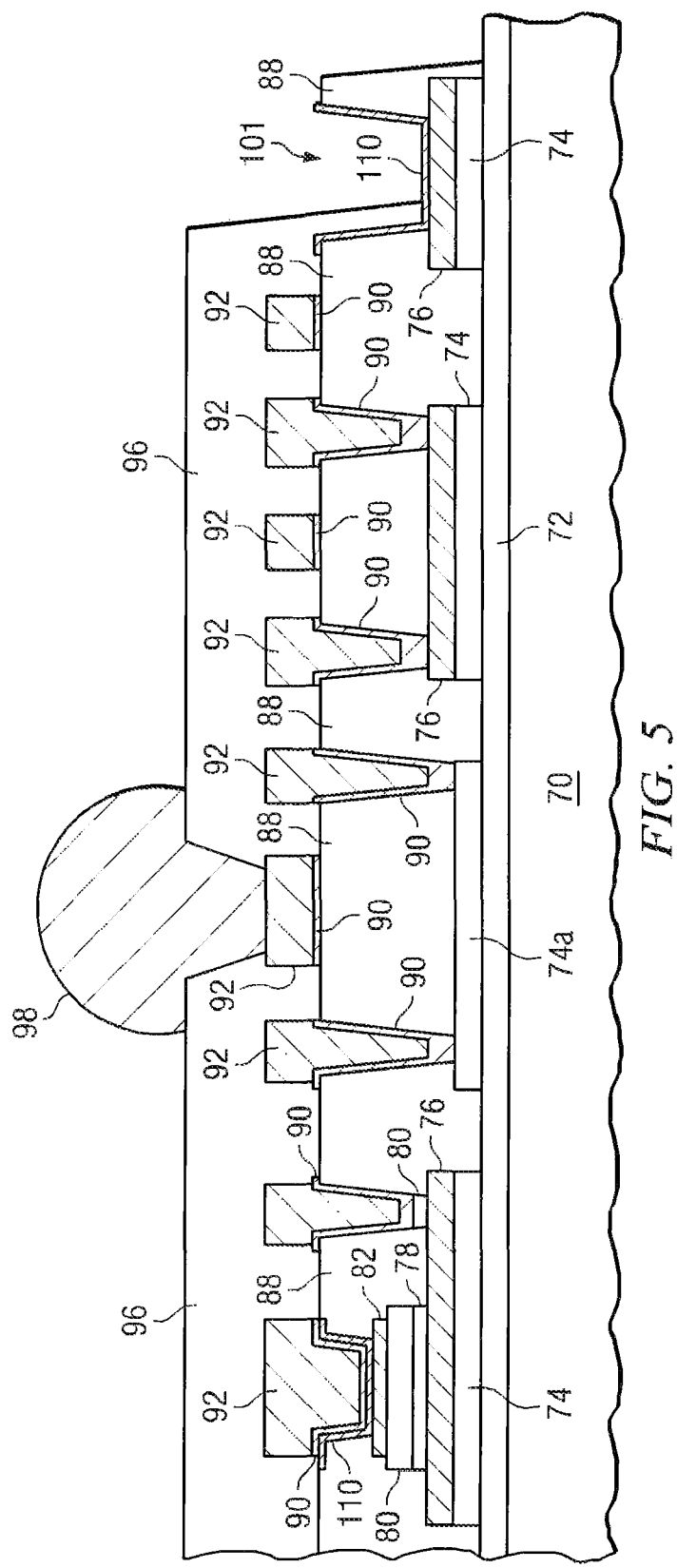
FIG. 5 illustrates another embodiment of the interconnect structure and passive circuit elements.

Another embodiment of the formation of IPD and interconnect structure is shown in FIG. 5. The substrate 70, passivation layer 72, resistive layer 74, electrically conductive layer 76, second resistive layer 78, and insulating layer 80 are formed, as described in FIG. 2. In FIG. 5, conductive layer 110 is deposited and patterned after the deposition and patterning of passivation layer 88. Conductive layer 110 also covers wire bonding pad 101. Note that there is no conductive layer 76 on resistive layer 74a which is made as a resistor component.

The combination of conductive layer 76, resistive layer 78, insulating layer 80, and conductive layers 110, 90, and 92 constitute a passive circuit, i.e., an MIM capacitor with series resistor. Note that the individual layers making the MIM capacitor and resistor are continuously deposited layer by layer over substrate, as described in FIG. 2a, without using photolithographic processes. The layers of the passive circuit elements, including the dielectric media of the MIM capacitor, are sensitive to particles introduced through masking, application of photoresist, etching, wet and dry clean, and wafer handling steps. The layer-by-layer formation of the passive circuit elements reduces defects and improves manufacturing yield. The photolithographic processes in forming the interconnect structure of FIG. 5 occur after deposition of multi-layers for formation of the passive circuit elements, i.e., the MIM capacitor and resistor layers.

While one or more embodiments of the present invention have been illustrated in detail, the skilled artisan will appreciate that modifications and adaptations to those embodiments may be made without departing from the scope of the present invention as set forth in the following claims.

What is claimed:
1. A semiconductor device, comprising:
 a substrate;
 a first insulating layer formed in direct contact with the substrate;
 a resistive layer formed over the first insulating layer;
 a capacitor formed over the substrate including,
  (a) a first conductive layer formed over the resistive layer,
  (b) a second insulating layer formed over a surface of the first conductive layer, and
  (c) a second conductive layer formed over the second insulating layer;
 a third insulating layer formed over the substrate, first conductive layer, and second conductive layer and extending through the first conductive layer and resistive layer to contact the first insulating layer;

a third conductive layer formed to extend through the third insulating layer to contact the first conductive layer outside the second insulating layer;

a fourth conductive layer formed over the third conductive layer and extending into the third insulating layer, wherein a portion of the fourth conductive layer is wound to form an inductor; and a fourth insulating layer formed over a surface of the third insulating layer opposite the substrate with an opening in the fourth insulating layer extending to expose a portion of the surface of the first conductive layer.

2. The semiconductor device of claim 1, further including an interconnect structure formed over the fourth insulating layer and contacting the fourth conductive layer.

3. A semiconductor device, comprising:
a substrate;
a first insulating layer formed in direct contact with the substrate;
a resistive layer formed over the first insulating layer;
a capacitor formed over the substrate including,
  (a) a first conductive layer formed over the resistive layer,
  (b) a second insulating layer formed over a surface of the first conductive layer, and
  (c) a second conductive layer formed over the second insulating layer;
a third insulating layer formed over the substrate, first conductive layer, and second conductive layer and extending through the first conductive layer and resistive layer to contact the first insulating layer; and
a third conductive layer formed over the third insulating layer, wherein a portion of the third conductive layer is wound to form an inductor.

4. The semiconductor device of claim 3, further including a fourth conductive layer formed between the third conductive layer and third insulating layer.

5. The semiconductor device of claim 3, further including a fourth insulating layer formed over a surface of the third insulating layer opposite the substrate with an opening in the fourth insulating layer extending to a portion of the surface of the first conductive layer.

6. The semiconductor device of claim 3, further including:
a fourth insulating layer formed over a surface of the third insulating layer opposite the substrate; and
an interconnect structure formed over the fourth insulating layer and contacting the third conductive layer.

7. A semiconductor device, comprising:
a substrate;
a first conductive layer formed over the substrate;
a first insulating layer formed over a surface of the first conductive layer;
a second conductive layer formed over the first insulating layer;
a second insulating layer formed over the substrate, first conductive layer, and second conductive layer;
a third conductive layer formed to extend through the second insulating layer to contact the first conductive layer outside the first insulating layer;
a fourth conductive layer formed over the third conductive layer, wherein a portion of the fourth conductive layer is wound to form an inductor;
a third insulating layer formed over the fourth conductive layer and a surface of the second insulating layer opposite the substrate with an opening in the third insulating layer extending to a portion of the surface of the first conductive layer;
a fourth insulating layer formed in contact with the substrate; and
a resistive layer formed over the fourth insulating layer;
wherein the second insulating layer extends through the first conductive layer and resistive layer to contact the fourth insulating layer.

8. The semiconductor device of claim 7, further including an interconnect structure formed over the third insulating layer and contacting the fourth conductive layer.

9. The semiconductor device of claim 7, wherein the first conductive layer, first insulating layer, and second conductive layer form a passive device.

10. A semiconductor device, comprising:
a substrate;
a first insulating layer formed in contact with the substrate;
a resistive layer formed over the first insulating layer;
a first conductive layer formed over the resistive layer;
a second insulating layer formed over a surface of the first conductive layer;
a second conductive layer formed over the second insulating layer;
a third insulating layer formed over the substrate, first conductive layer, and second conductive layer and extending through the first conductive layer and resistive layer to contact the first insulating layer; and
a third conductive layer formed over the third insulating layer, wherein a portion of the third conductive layer is wound to form an inductor.

11. The semiconductor device of claim 10, wherein the first conductive layer, second insulating layer, and second conductive layer form a passive device.

12. The semiconductor device of claim 10, further including a fourth conductive layer formed between the third conductive layer and third insulating layer.

13. The semiconductor device of claim 10, further including an interconnect structure formed over the third conductive layer.

14. The semiconductor device of claim 10, further including a fourth insulating layer formed over a surface of the third insulating layer opposite the substrate with an opening in the fourth insulating layer extending to a portion of the surface of the first conductive layer.

* * * * *